United States Patent
Mori et al.

[11] Patent Number: 5,574,556
[45] Date of Patent: Nov. 12, 1996

[54] STAGE MECHANISM IN EXPOSURE APPARATUS

[75] Inventors: Tetsuzo Mori, Atsugi; Hidehiko Fujioka, Yamato, both of Japan

[73] Assignee: Canon Kabushiki Kaisha, Tokyo, Japan

[21] Appl. No.: 621,512

[22] Filed: Mar. 25, 1996

Related U.S. Application Data

[63] Continuation of Ser. No. 267,367, Jun. 29, 1994, abandoned.

[30] Foreign Application Priority Data

Jun. 30, 1993 [JP] Japan .................................. 5-161023

[51] Int. Cl.$^6$ .......................... G01N 21/01; G01B 11/27; G05B 1/06
[52] U.S. Cl. .......................... 356/244; 356/399; 356/363; 318/653; 318/687; 318/640
[58] Field of Search ..................... 356/244, 375, 356/376, 399–401, 363, 358; 355/53, 72; 250/548, 442.1, 492.2; 318/640, 38, 135, 687, 653, 133

[56] References Cited

U.S. PATENT DOCUMENTS

| | | | |
|---|---|---|---|
| 4,506,205 | 3/1985 | Trost et al. | 318/640 |
| 4,507,597 | 3/1985 | Trost | 318/653 |
| 4,654,571 | 3/1987 | Hinds | 318/653 |
| 4,655,594 | 4/1987 | Wittekoek et al. | 356/244 |
| 4,676,649 | 6/1987 | Phillips | 356/401 |
| 4,742,286 | 5/1988 | Phillips | 318/687 |
| 4,814,625 | 3/1989 | Yabu | 356/548 |
| 5,026,239 | 6/1991 | Chiba et al. | 414/217 |
| 5,066,131 | 11/1991 | Iwata et al. | 356/401 |
| 5,238,354 | 8/1993 | Volovich | 356/400 |
| 5,253,012 | 10/1993 | Chiba et al. | 355/53 |
| 5,285,142 | 2/1994 | Galburt et al. | 356/401 |
| 5,369,490 | 11/1994 | Kawai et al. | 356/376 |

FOREIGN PATENT DOCUMENTS 60-7724 1/1985 Japan .

OTHER PUBLICATIONS

"Electronic Material", Mar. 1990, pages 67 through 72.

Primary Examiner—Hoa Q. Pham
Attorney, Agent, or Firm—Fitzpatrick, Cella, Harper & Scinto

[57] ABSTRACT

A stage mechanism suitable used in an exposure apparatus is disclosed, wherein heat generation of a coil assembly of a stage driving motor is prevented from adversely affecting a semiconductor substrate or measurement by a laser interferometer. A wafer chuck and the laser interferometer are disposed at a side of a base plate, and a stage and an electromagnetic coil for dirving the stage are disposed at the other side of the base plate. The wafer chuck and the stage are coupled to each other by a coupling member which extends through a bore formed in the base plate.

8 Claims, 6 Drawing Sheets

STAGE MECHANISM IN EXPOSURE APPARATUS

This application is a continuation of application Ser. No. 08/267,367, filed Jun. 29, 1994, now abandoned.

FIELD OF THE INVENTION AND RELATED ART

This invention relates to a stage mechanism particularly suitably usable in an exposure apparatus for manufacture of microdevices such as semiconductor devices, for example. More particularly, the invention is concerned with a stage mechanism for moving and positioning a substrate such as a semiconductor wafer, for example, by using the electromagnetic drive of a plane motor or a linear motor, for example.

FIG. 6 shows an example a of known type of stage mechanism in an exposure apparatus, such as discussed in a magazine "Electron Material", March 1990, page 69. In this mechanism, a platform 501 movable along a plane is mounted to a base plate (guide plate) 503 through air bearing pads 502. Wafer chuck 504 and a mirror 505, to be used with a laser interferometer, are mounted on the platform 501.

Coil assemblies 506 are fixed to the base plate 503, and a magnetic field is produced in response to the flow of electric current through each coil assembly 506. Through cooperation of this magnetic field with a magnetic field of a magnet 507, a force is applied to the platform 501. Thus, it functions as an X-Y stage. Namely, a wafer which is placed on the wafer chuck 504, mounted on the platform 501, is moved to a desired position within an X-Y coordinate plane.

SUMMARY OF THE INVENTION

In this type of mechanism, coil assemblies are mounted around a wafer chuck and a mirror to be used with a laser interferometer. This leads to some inconveniences such as follows:

First, due to heat produced by the coil assemblies, the air at the light path of the laser interferometer may be disturbed to hinder stable measurement. If this occurs, a positioning error is produced when a semiconductor wafer is positioned at a desired position. This may cause poor performance of semiconductor devices.

Second, due to heat produced by the coil assemblies, the temperature of a wafer may rise. Such temperature rise may end in poor performance of semiconductor devices.

Third, there is a problem in design. Placing the coil assemblies around the wafer chuck necessarily restricts the latitude of the wafer conveying mechanism. Namely, in this design a mechanism for loading/unloading a wafer on/from a wafer chuck has to be placed so as not to block the light path of the laser interferometer and also placed separately from the coil assemblies.

It is accordingly an object of the present invention to provide an improved stage mechanism by which at least one of the inconveniences described above can be avoided.

It is another object of the present invention to provided an improved stage mechanism by which any adverse effect of heat produced by a coil assembly to measurement through a laser interferometer or to a wafer itself is prevented.

It is a further object of the present invention to provide an improved stage mechanism having a large design placement latitude.

In accordance with an aspect of the present invention, there is provided a stage mechanism comprising: a base having first and second faces and an opening extending from the first face to the second face; a substrate holder disposed at the first face side of said base; a movable member disposed at the second face side of said base; a connecting member for connecting said substrate holder and said movable member through the opening of said base; and electromagnetic coil means disposed at the second face side of said base, for supplying kinetic energy to said movable member.

In a preferred form of the invention, a laser interferometer is preferably disposed at the first face side of the base.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

First Embodiment

Figure 1:
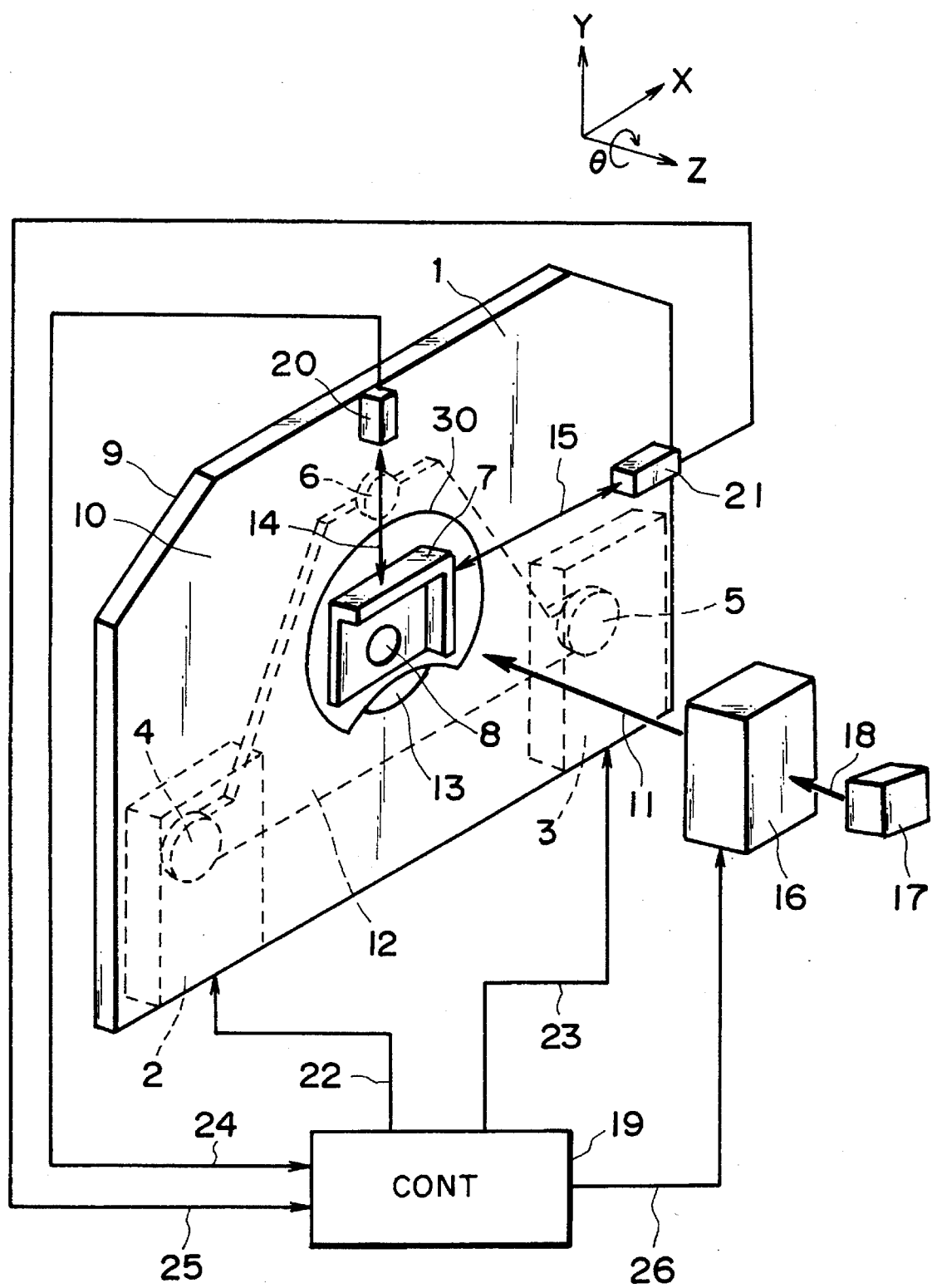
FIG. 1 is a perspective view schematically showing an exposure apparatus according to a first embodiment of the present invention.
Figure 2:
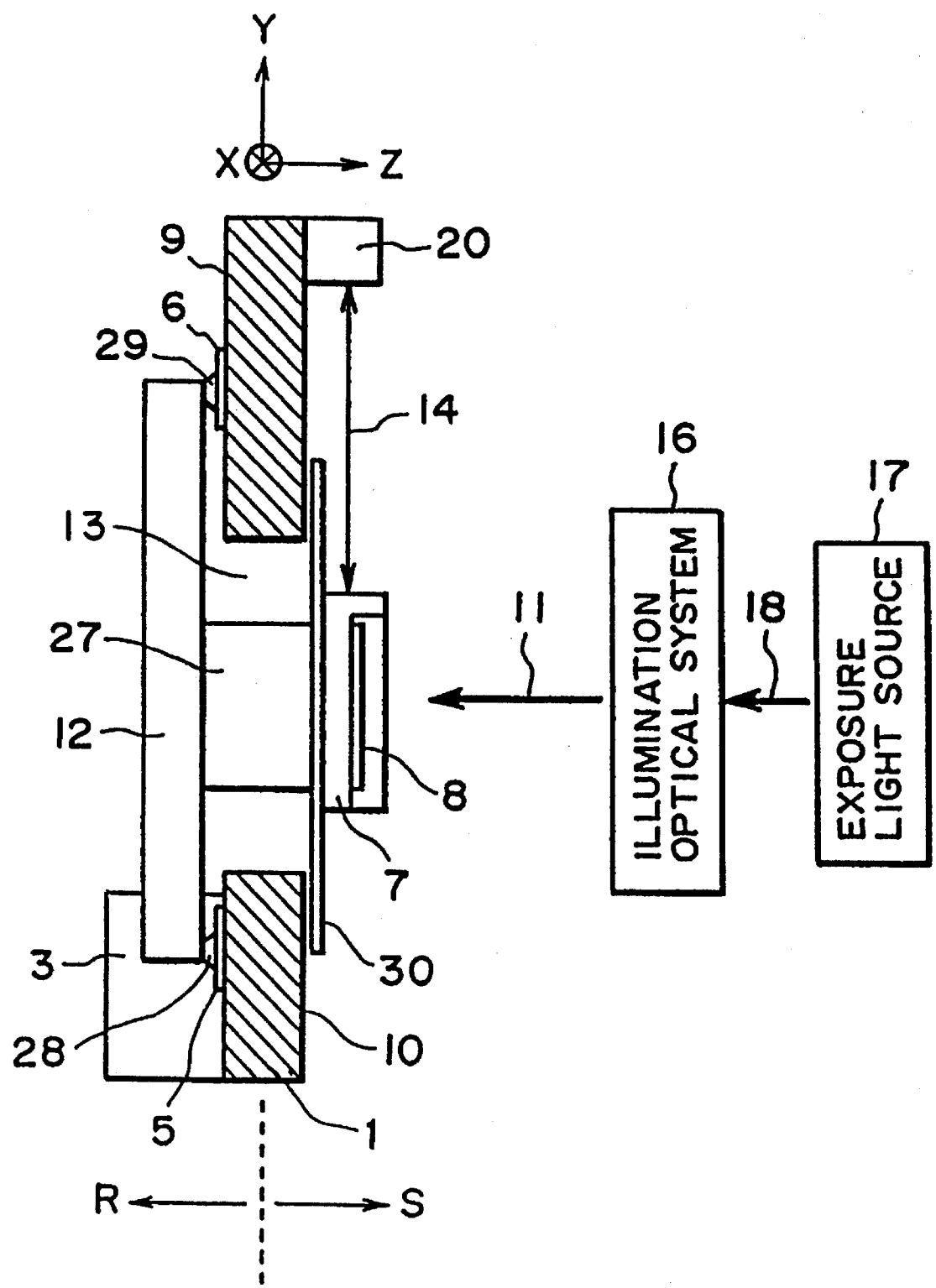
FIG. 2 is a sectional view of the apparatus of the FIG. 1 embodiment.

FIGS. 1 and 2 show a first embodiment of the present invention which is applied to an exposure apparatus to be used in the processes for manufacturing microdevices such as semiconductor devices, for example, upon a substrate.

In FIG. 1, denoted by 1 is a base plate which provides a stage guiding surface and also which functions as a thermally isolating wall. Denoted by 2 and 3 are electromagnetic coil assemblies which serve as a drive power source in X, Y and θ directions. Denoted at 4, 5 and 6 are air pads for floating a stage 12 from a guide face 9 of the base plate 1. Denoted at 7 is a mirror to be used with a laser interferometer. Denoted at 8 is a wafer chuck for holding a semiconductor wafer at an exposure station. Denoted at 9 is the guide face (as described) of the base plate 1. Denoted at 10 is a non-guide face of the base plate 1.

Denoted at 11 is exposure light by which a pattern of a mask (not shown) can be transferred to the wafer held by the wafer chuck 8. Such a lithographic process may be, as is known in the art, one for microdevice manufacturing processes or, for manufacture of microdevices such as semiconductor devices, for example.

Denoted at 12 is the stage (as described), and denoted at 13 a throughbore (opening) formed in the base plate 1. Denoted at 14 and 15 are light paths of laser lights from laser interferometers 20 and 21 where each serves as position/speed detecting means. Namely, the position and moving speed of the wafer chuck 8 can be detected on the basis of the outputs of the laser interferometers 20 and 21. Denoted by 16 is an illumination optical system for illuminating a mask and a wafer with the exposure light 11. Light 18 from an exposure light source 17 is supplied to this illumination optical system 16.

Denoted at 19 is a control device for the exposure apparatus. Denoted at 22 and 23 are electric current signals supplied to the coil assemblies 2 and 3 from the control device 19. Denoted at 24 and 25 are position/speed information signals supplied to the control device 19 from the laser interferometers 20 and 21. Denoted at 26 is an exposure timing signal supplied to the illumination optical system from the control device. Denoted at 30 is a blocking plate for covering the bore 13 of the base plate.

The operation of this embodiment will now be explained.

First, a semiconductor wafer is placed on the wafer chuck 8, and it is held fixed thereon through vacuum attraction, for example. Here, the wafer is so placed that its surface to be exposed, namely, the surface thereof to which a resist is applied, is able to be exposed with the exposure light 11. Subsequently, the position of the semiconductor wafer placed on the wafer chuck 8, with respect to the illumination optical system 16, is adjusted so as to allow exposure of a desired location on the semiconductor wafer.

The wafer chuck 8 and the mirror 13 to be used with the laser interferometers, are relatively held fixed so that their positional interrelation is unchangeable. Thus, the position/speed of the semiconductor wafer held on the wafer chuck 8 can be detected on the basis of the outputs of the position/speed detecting means (laser interferometers) 20 and 21. The control device 19 serves to apply electric current signals 22 and 23 to the coil assemblies 2 and 3 so as to reduce, to zero, the difference between the position/speed information signal 24 (25) supplied from the position/speed detecting means 20 (21) and a target position/speed.

The stage 12 can be driven by the magnetic fields of the coil assemblies 2 and 3 produced in response to the electric current signals 22 and 23. By specifically arranging the structure of the coil assemblies, the stage 12 can be moved in the X, Y and θ directions. Details of such structure is known in the art (Japanese Laid-Open Patent Application, Laid-Open No. 7724/1985), and description of it is omitted here.

The wafer chuck 8 and the mirror 7 are coupled to the stage 12 by means of a coupling member 27 (FIG. 2) extending through the bore 13 of the base plate 1. Thus, the stage 12 can be moved as a unit with the wafer chuck 8 and the mirror 7, such that the semiconductor wafer placed on the wafer chuck 8 can be positioned at a desired position. Also, the semiconductor wafer can be moved at a desired speed.

At the moment at which the position/speed of the semiconductor wafer reaches the desired or target position/speed, as described, the control device 19 applied an exposure timing signal 26 to the illumination optical system 16. In response, the illumination optical system 16 projects the exposure light 11 to the semiconductor wafer.

Referring to FIG. 2, the present embodiment will be explained in more detail. In this embodiment, as seen in FIG. 2, each of the wafer chuck 8, the mirror 7 and the laser interferometers (position/speed detecting means) 20 and 21 are disposed at the side S of the base plate 1. Also, at this side are the laser light paths 14 and 15 of the laser interferometers 20 and 21 as well as the light path of the exposure light 11. On the other hand, the coil assemblies 2 and 3 and the stage 12 are placed at the side R of the base plate 1.

Also, it is seen that the mirror 7 and the wafer chuck 8 are coupled to the stage 12 by the coupling member 27, through the bore (opening) 13 formed in the base plate 1. While the coupling member 12 is illustrated in this embodiment as being a column-like member, it may have a different shape other than a column-like shape. Further, while the coupling member 27 comprises a single member in this embodiment, plural coupling members may be used.

The diameter X of the bore 13 formed in the base plate 1 desirably satisfies the following relation:

$$X > A + B - C$$

where A is the diameter of the semiconductor wafer, B is the diameter of the coupling member 27 and C is the length of the minor (shorter) side of each exposure shot on the wafer. Preferably, however, taking into account the size of each exposure shot, the layout of shots on the semiconductor wafer and the stroke latitude of the stage 12, the diameter X of the bore 13 may be large than "(A+B)".

In the embodiment of FIG. 2, a relation B–A is adopted. Thus, in a case of an exposure apparatus which is to be used with six-inch wafers:

$$X > 304.8 \text{ (mm)}$$

In a case of an exposure apparatus to be used with eight-inch wafers:

$$X > 400 \text{ (mm)}$$

It is to be noted here that the diameter B of the coupling member 27 may be determined synthetically in design of an exposure apparatus and, therefore, it may take various values. Thus, the diameter X of the bore 13 of the base plate 1 is not limited to the above-described ranges.

In the first embodiment of the present invention as described above, the wafer chuck 8 and the mirror 7 as well as the laser light paths 14 and 15 are isolated from the coil assemblies 2 and 3 of the plane motor, by means of the base plate 1. Thus, the present embodiment assures a high-precision exposure apparatus.

Further, the coupling member 17 for connecting the wafer chuck 8 and the mirror 7 to the stage 12 has a diameter of about that of a semiconductor wafer to be used, and high rigidity is assured. This is very effective for enhanced controllability of the position or moving speed of a semiconductor wafer.

Second Embodiment

A second embodiment of the present invention will now be explained, particularly with respect to the differences thereof from the first embodiment.

Figure 3:
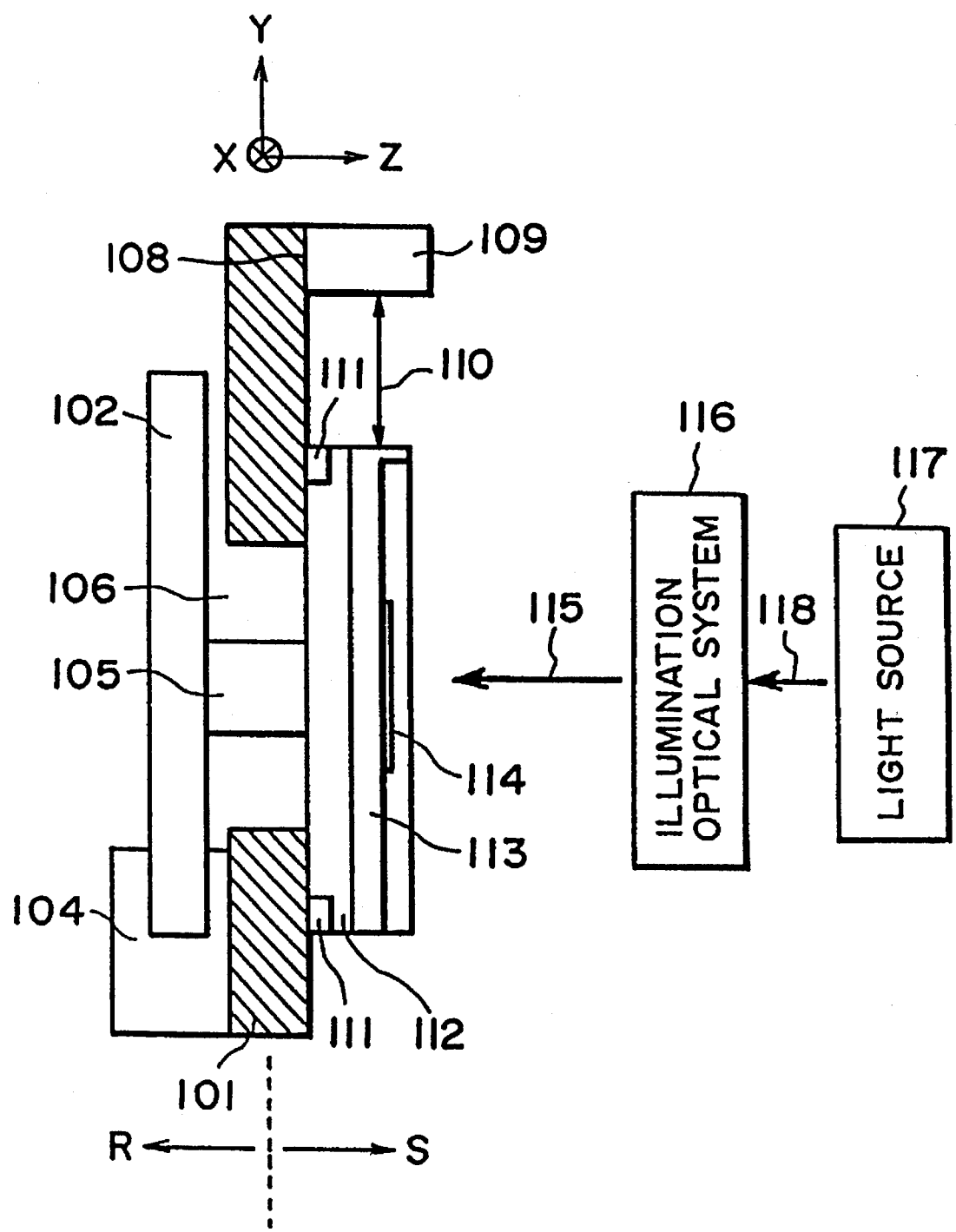
FIG. 3 is a sectional view of an exposure apparatus according to a second embodiment of the present invention.

FIG. 3 is a sectional view similar to FIG. 2, and it shows the second embodiment of the present invention. In FIG. 3, denoted at 101 is a base plate which provides a stage guide face and also which serves as a thermally isolating wall. Denoted at 102 is a stage. Denoted at 104 is a coil assembly which serves as a drive power source in X, Y and θ directions. Denoted at 105 is a coupling member for coupling a wafer chuck and the stage with each other. Denoted at 106 is a bore (opening) formed in the base plate 101. Denoted at 108 is a wafer side guide face of the base plate 101. Denoted at 109 is a position/speed detecting means which comprises a laser interferometer. Denoted at 110 is a laser light path of the laser interferometer 109. Denoted at 111 are air pads. Denoted at 112 is a tilt stage. Denoted at 113 is a mirror to be used with the laser interferometer. Denoted at 114 is a wafer chuck. Denoted at 115 is exposure light.

Denoted at 116 is an illumination optical system. Denoted at 117 is a light source. Denoted at 118 is light from the light source 117.

In this embodiment, as seen in FIG. 3, each of the wafer chuck 114, the mirror 113, the tilt Z stage 112, the air pads 111 and the position/speed detecting means 109 are disposed at the side S of the base plate 101. Also, at this side, there is the laser light path 110. On the other hand, the stage 102 and the coil assembly 104 are disposed at the side R of the base plate 101.

The tilt Z stage 112 and the stage 102 are coupled to each other by the coupling member 105 extending through the bore 106 formed in the base plate 101. Further, the mirror 113 and the wafer chuck 114 are mounted on this tilt Z stage 112.

Like the first embodiment described hereinbefore, as the stage 102 is driven by the magnetic field of the coil assembly 104, the members coupled to this stage 102 move together as a unit with it. Namely, the tilt Z stage 112 and the mirror 113 as well as the wafer chuck 114 and the coupling member 105 all move integrally with the stage 102.

If a semiconductor wafer is placed on the wafer chuck 114 and it is held fixed through vacuum attraction, for example, then the wafer can be displaced along the X-Y plane so that a desired position on the wafer can be irradiated with the exposure light 115. In this example, the wafer side guide face 108 of the base plate 101 serves as a guiding means. This is different from the first embodiment. Thus, the air pads 111 are provided and disposed so that each can float from the wafer side guide face 108 with a minute spacing maintained therebetween.

The diameter X of the bore 106 formed in the base plate 101 desirably satisfies the following relation, like the first embodiment:

$$X > A + B - C$$

where A is the diameter of the semiconductor wafer, B is the diameter of the coupling member 106 and C is the length of the minor (shorter) side of each exposure shot on the wafer. Preferably, however, taking into account the size of each exposure shot, the layout of shots on the semiconductor wafer and the stroke latitude of the stage 102, the diameter X of the bore 106 may be larger than "(A+B)".

In the embodiment of FIG. 3, a relation B=A/2 is adopted. Thus, in a case of an exposure apparatus which is to be used with six-inch wafers:

$$X > 228.6 \text{ (mm)}$$

In a case of an exposure apparatus to be used with eight-inch wafers:

$$X > 300 \text{ (mm)}$$

It is to be noted here that the diameter B of the coupling member 105 may be determined synthetically in design of an exposure apparatus and, therefore, it may take various values. Thus, the diameter X of the bore 106 of the base plate 101 is not limited to the above-described ranges.

In the second embodiment of the present invention as described above, the wafer chuck and the mirror as well as the laser light paths are isolated from the coil assembly 104 of the plane motor, by means of the base plate 101. Thus, the present embodiment assures a high-precision exposure apparatus.

Further, the wafer side face of the base plate serves as a guide face. Thus, even if the coupling member for connecting the wafer chuck and the mirror to the stage has a diameter less than a half of the diameter of a semiconductor wafer to be used, good controllability of the position or moving speed of a semiconductor wafer placed on the wafer chuck is assured.

Moreover, the portion for supporting a semiconductor wafer is disposed intimately to the wafer side guide face of the base plate through the air pads, so as to cover the opening formed in the base plate. This effectively isolates the ambience around the semiconductor wafer from the ambience around the coil assembly. This point is particularly advantageous in an X-ray exposure apparatus wherein a wafer is to be placed in an ambience of helium gas.

In accordance with these embodiments of the present invention, as described, even if an actuator such as a plane motor or linear motor whose coil assembly produces heat is used, disturbance of the ambience of laser light path of a laser interferometer can be prevented and, therefore, high precision measurement is assured. Further, any adverse effect of heat produced by the coil assembly to a semiconductor substrate or to a supporting member can be prevented.

Further, no coil assembly is placed about a substrate holding portion or a mirror to be used with a laser interferometer. Thus, there is a large design latitude with respect to the placement of the laser light path or a waver conveying mechanism. This effectively leads to reduction in time for development of an exposure apparatus, to simplification of structure, to improvement of reliability and a reduction in cost.

Next, an embodiment of the present invention which is applied to a semiconductor device manufacturing method utilizing an exposure apparatus according to one of the preceding embodiments, will be explained.

Figure 4:
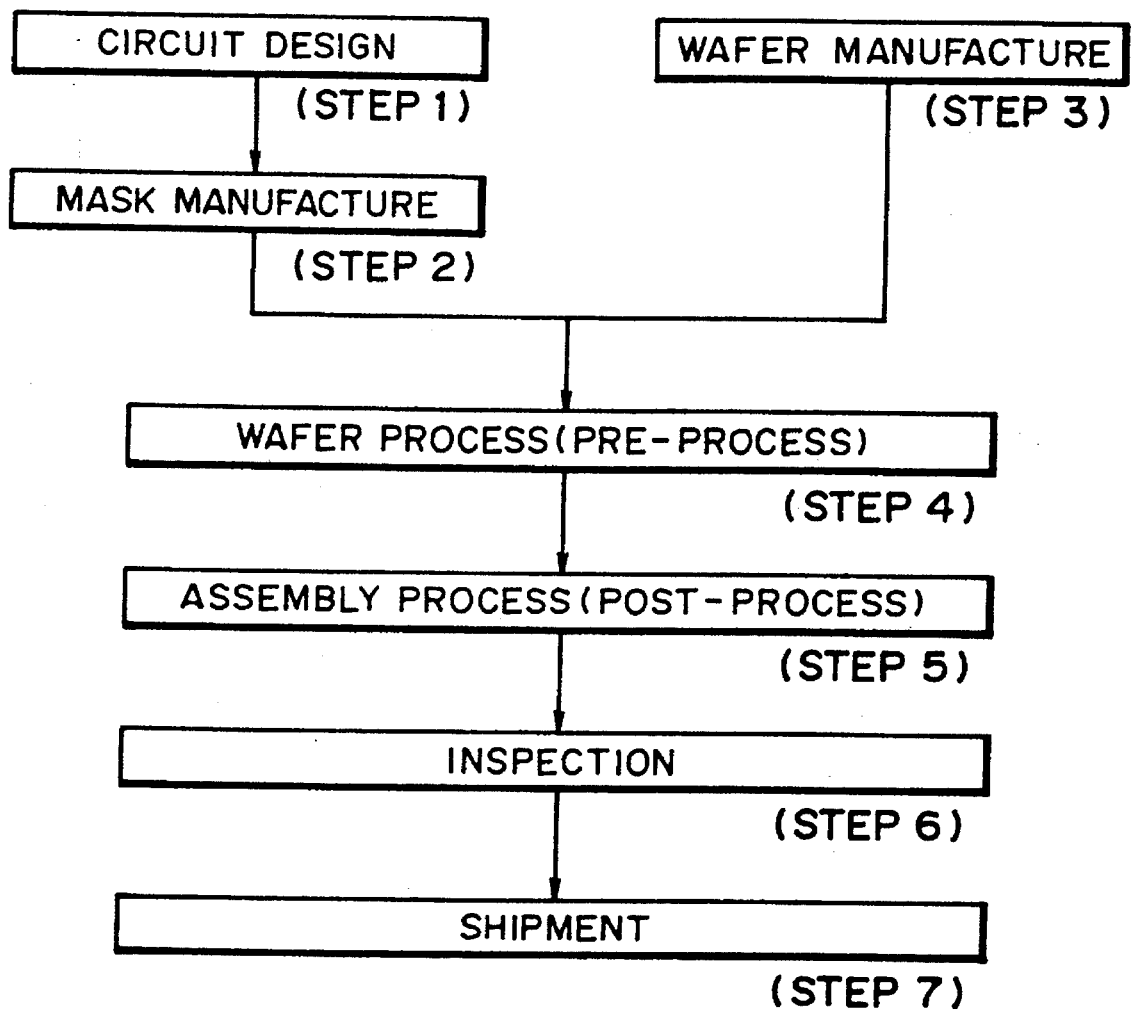
FIG. 4 is a flow chart of semiconductor device manufacturing processes.

FIG. 4 is a flow chart of the sequence of manufacturing a semiconductor device such as a semiconductor chip (e.g. IC or LSI), a liquid crystal panel or a CCD, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the prepared mask and wafer, circuits are formed on the wafer through lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein operability checks, durability checks, and so on of the semiconductor devices produced by step 5 are carried out. With these processes, semiconductor devices are finished and they are shipped (step 7).

Figure 5:
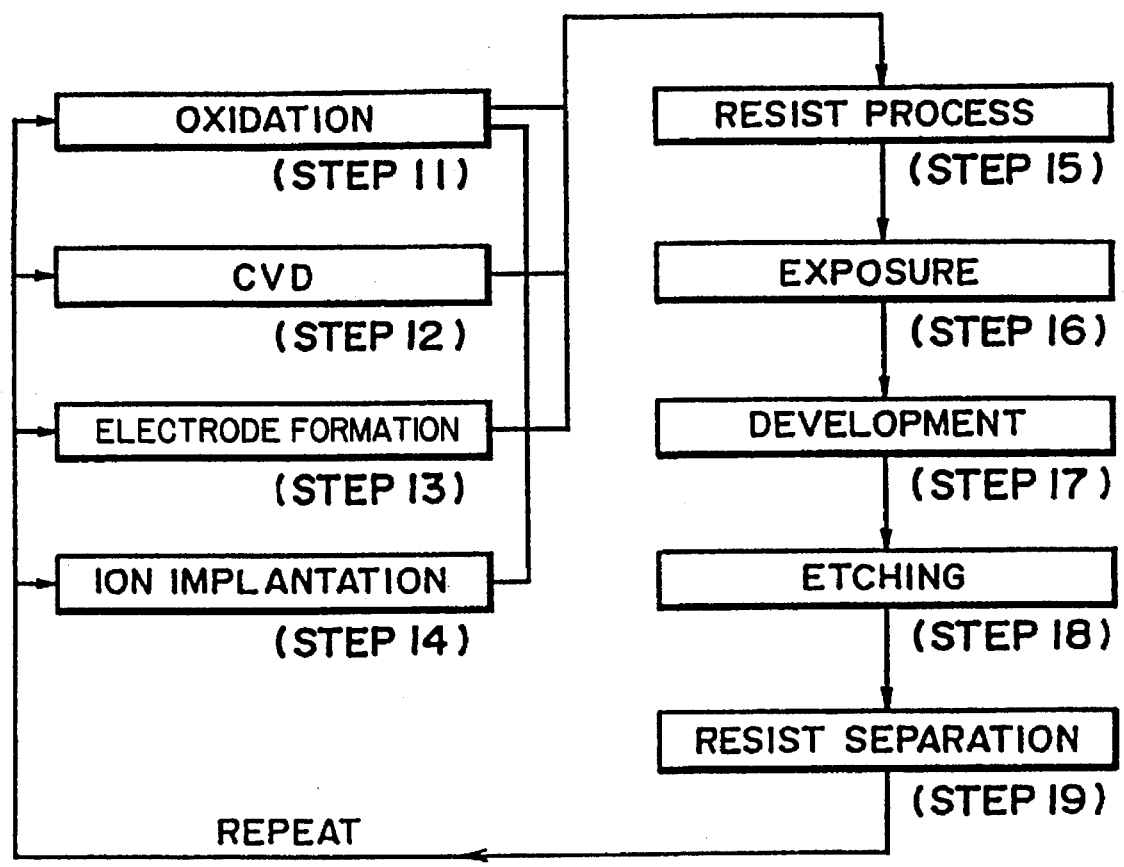
FIG. 5 is a flow chart of a wafer process.
Figure 6:
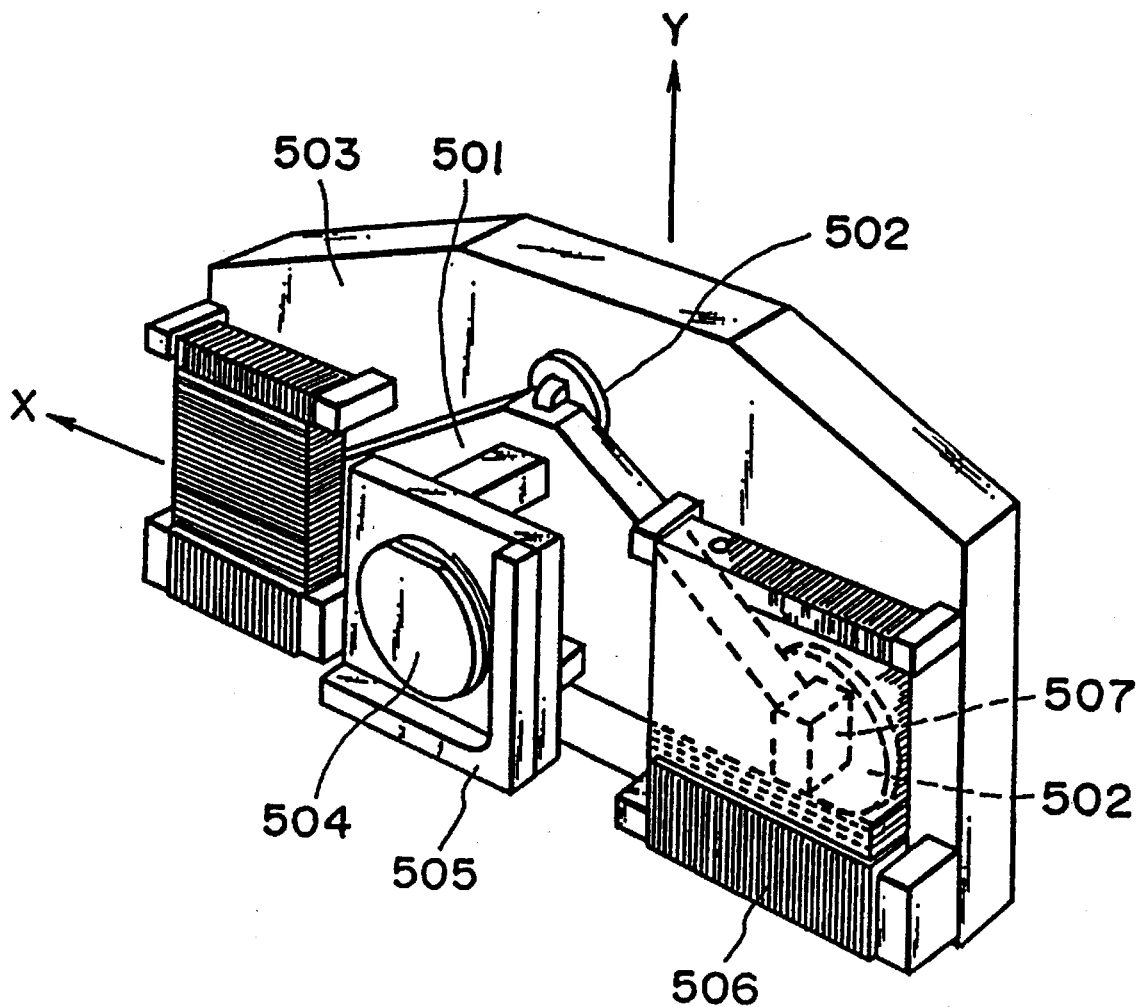
FIG. 6 is a perspective view of a known type stage mechanism.

FIG. 5 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are supposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. A stage mechanism, comprising:
   a base having first and second faces and having a bore extending from the first face to the second face;
   a substrate holder disposed at the first face side of said base and being movable in a direction along the first face of said base;
   a movable member disposed at the second face side of said base;
   a connecting member for connecting said substrate holder and said movable member through the bore of said base;
   a blocking member, being movable with said movable member, for substantially covering the bore of said base;
   electromagnetic coil means, disposed at the second face side of said base, for supplying kinetic energy to said movable member; and
   measuring means, disposed at the first face side of said base, for detecting positional information of said substrate holder with respect to the direction along the first face of said base.

2. A mechanism according to claim 1, wherein said measuring means comprises a laser measuring device.

3. A mechanism according to claim 1, wherein the first face of said base serves as a guide face for said substrate holder.

4. A mechanism according to claim 1, wherein the second face of said base serves as a guide face for said movable member.

5. An exposure apparatus, comprising:
   a stage mechanism for support a substrate; and
   an optical system for exposing the substrate held by said stage mechanism,
   wherein said stage mechanism comprises (i) a base having first and second faces and having a bore extending from the first face to the second face, (ii) a substrate holder disposed at the first face side of said base and being movable in a direction along the first face of said base, (iii) a movable member disposed at the second face side of said base, (iv) a connecting member for connecting said substrate holder and said movable member through the bore of said base, (v) a blocking member, being movable with said movable member, for substantially covering the bore of said base, (vi) electromagnetic coil means, disposed at the second face side of said base, for supplying kinetic energy to said movable member, and (vii) measuring means, disposed at the first face side of said base, for detecting positional information of said substrate holder with respect to the direction along the first face of said base.

6. An apparatus according to claim 5, wherein said measuring means comprises a laser measuring device.

7. An apparatus according to claim 5, wherein the substrate comprises a wafer to which a pattern is to be transferred.

8. An apparatus according to claim 7, wherein said optical system serves to transfer a pattern of a mask by exposure.

* * * * *

UNITED STATES PATENT AND TRADEMARK OFFICE
CERTIFICATE OF CORRECTION

PATENT NO. : 5,574,556
DATED : November 12, 1996
INVENTOR(S) : TETSUZO MORI, ET AL.

Page 1 of 2

It is certified that error appears in the above-indentified patent and that said Letters Patent is hereby corrected as shown below:

ON THE COVER PAGE

IN THE ABSTRACT [57]

Line 1, "suitable" should read --suitably--.
    Line 7, "dirving" should read --driving--.

COLUMN 1

Line 18, "a of" should read --of a--.
    Line 53, "design" should read --design,--.
    Line 61, "provided" should read --provide--.

COLUMN 2

Line 58, "cesses or," should read --cesses, or--.
    Line 64, "21" should read --21,--.

COLUMN 3

Line 23, "mirror 13" should read --mirror 13,--.
    Line 52, "applied" should read --applies--.

UNITED STATES PATENT AND TRADEMARK OFFICE
CERTIFICATE OF CORRECTION

PATENT NO. : 5,574,556

DATED : November 12, 1996

INVENTOR(S) : TETSUZO MORI, ET AL.

It is certified that error appears in the above-indentified patent and that said Letters Patent is hereby corrected as shown below:

COLUMN 4

Line 17, "large" should read --larger--.
Line 18, "B-A" should read --B=A--.

Signed and Sealed this

Twentieth Day of May, 1997

*Attest:*

BRUCE LEHMAN

*Attesting Officer*     *Commissioner of Patents and Trademarks*